US012405334B1

(12) United States Patent
Wen et al.

(10) Patent No.: US 12,405,334 B1
(45) Date of Patent: Sep. 2, 2025

(54) SYSTEM AND METHOD FOR MULTI-ECHO STEADY-STATE SEQUENCE WITH IMPROVED FAT SUPPRESSION USING ADAPTED DIXON TECHNIQUE

(71) Applicants: GE Precision Healthcare LLC, Waukesha, WI (US); NEW YORK SOCIETY FOR THE RELIEF OF THE RUPTURED AND CRIPPLED, MAINTAINING THE HO, New York, NY (US)

(72) Inventors: Yan Wen, New York, NY (US); Mei Kei Maggie Fung, Jersey City, NJ (US); Kang Wang, Sussex, WI (US); Ek Tsoon Tan, Westbury, NY (US); Darryl Brett Sneag, Plainview, NY (US)

(73) Assignees: GE Precision Healthcare LLC, Wauwatosa, WI (US); NEW YORK SOCIETY FOR THE RELIEF OF THE RUPTURED AND CRIPPLED, MAINTAINING THE HOSPITAL FOR SPECIAL SURGERY, New York, NY (US)

( * ) Notice: Subject to any disclaimer, the term of this patent is extended or adjusted under 35 U.S.C. 154(b) by 0 days.

(21) Appl. No.: 18/629,545

(22) Filed: Apr. 8, 2024

(51) Int. Cl.
*G01R 33/56* (2006.01)
*G06T 7/00* (2017.01)

(52) U.S. Cl.
CPC ........ *G01R 33/5607* (2013.01); *G06T 7/0016* (2013.01); *G06T 2207/10088* (2013.01); *G06T 2207/20* (2013.01); *G06T 2207/30016* (2013.01)

(58) Field of Classification Search
CPC .............. G01R 33/5607; G06T 2207/10088
See application file for complete search history.

(56) References Cited

U.S. PATENT DOCUMENTS

| 6,147,492 A | * | 11/2000 | Zhang | ............... G01R 33/4828 |
| | | | | 324/309 |
| 2005/0165296 A1 | * | 7/2005 | Ma | .................. G01R 33/56563 |
| | | | | 600/410 |

(Continued)

OTHER PUBLICATIONS

Qin et al., "3D Double-Echo Steady-State with Water Excitation MR Imaging of the Intraparotid Facial Nerve at 1.5T: A Pilot Study," American Journal of Neuroradiol, Aug. 2011, 6 pgs.

(Continued)

*Primary Examiner* — Jason M Ip
(74) *Attorney, Agent, or Firm* — Fletcher Yoder, P.C.

(57) ABSTRACT

A computer-implemented method for suppressing fat in reconstructed magnetic resonance imaging data includes generating, via a processor, a first echo image and a second echo image from magnetic resonance scan data acquired of a subject with a magnetic resonance scanner utilizing a multi-echo steady state sequence. The computer-implemented method also includes estimating, via the processor, an echo phase difference between the first echo image and the second echo image to generate an echo phase difference image. The computer-implemented method further includes identifying, via the processor, voxels in the echo phase difference image having an extra chemical shift phase. The computer-implemented method even further includes removing, via the processor, signals of the voxels identified having the extra chemical shift phase in both the first echo image and the second echo image to generate a first fat-removed image and a second fat-removed image, respectively.

17 Claims, 11 Drawing Sheets

(56) References Cited

U.S. PATENT DOCUMENTS

2010/0195885 A1* 8/2010 Ma ........................ G16H 30/40
  382/131
2010/0260397 A1* 10/2010 Block ................ G01R 33/4828
  324/307

OTHER PUBLICATIONS

Kwon et al., "Clinical validation of the 3-dimensional double-echo steady-state with water excitation sequence of MR neurography for preoperative facial and lingual nerve identification," Imaging Science in Dentistry, 2022, 8 pgs.

Jang et al., "Ultrashort echo time Cones double echo steady state (UTE-Cones-DESS) for rapid morphological imaging of short T2 tissues," Magnetic Resonance in Medicine, 2021, 12 pgs.

\* cited by examiner

Fat-Removed $I_1$ — 218

Fat-Removed $I_2$ — 220

SYSTEM AND METHOD FOR MULTI-ECHO STEADY-STATE SEQUENCE WITH IMPROVED FAT SUPPRESSION USING ADAPTED DIXON TECHNIQUE

BACKGROUND

The subject matter disclosed herein relates to medical imaging and, more particularly, to systems and methods for multi-echo steady-state sequence with improved fat suppression using adapted Dixon technique.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

MR neurography is very similar to traditional MRI. In MR neurography, thin section, high-resolution sequences with T2-weighting and fat suppression are performed that are dedicated to optimally increase the discernibility of the nerve tissue signal. It is easier for physicians to localize the site of nerve injury and to diagnose the underlying etiology when they are able to view the nerves.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a computer-implemented method for suppressing fat in reconstructed magnetic resonance imaging data is provided. The computer-implemented method includes generating, via a processor, a first echo image and a second echo image from magnetic resonance scan data acquired of a subject with a magnetic resonance scanner utilizing a multi-echo steady state sequence. The computer-implemented method also includes estimating, via the processor, an echo phase difference between the first echo image and the second echo image to generate an echo phase difference image. The computer-implemented method further includes identifying, via the processor, voxels in the echo phase difference image having an extra chemical shift phase. The computer-implemented method even further includes removing, via the processor, signals of the voxels identified having the extra chemical shift phase in both the first echo image and the second echo image to generate a first fat-removed image and a second fat-removed image, respectively.

In another embodiment, a system for suppressing fat in reconstructed magnetic resonance imaging data is provided. The system includes memory encoding processor-executable routines. The system also includes a processor configured to access the memory and to execute the processor-executable routines, wherein the processor-executable routines, when executed by the processor, cause the processor to perform actions. The actions include generating a first echo image and a second echo image from magnetic resonance scan data acquired of a subject with a magnetic resonance scanner utilizing a multi-echo steady state sequence. The actions also include estimating an echo phase difference between the first echo image and the second echo image to generate an echo phase difference image. The actions further include identifying voxels in the echo phase difference image having an extra chemical shift phase. The actions even further include removing signals of the voxels identified having the extra chemical shift phase in both the first echo image and the second echo image to generate a first fat-removed image and a second fat-removed image, respectively.

In a further embodiment, a non-transitory computer-readable medium is provided. The non-transitory computer-readable medium including processor-executable code that when executed by a processor, causes the processor to perform actions. The actions include generating a first echo image and a second echo image from magnetic resonance scan data acquired of a subject with a magnetic resonance scanner utilizing a multi-echo steady state sequence. The actions also include estimating an echo phase difference between the first echo image and the second echo image to generate an echo phase difference image. The actions further include identifying voxels in the echo phase difference image having an extra chemical shift phase. The actions even further include removing signals of the voxels identified having the extra chemical shift phase in both the first echo image and the second echo image to generate a first fat-removed image and a second fat-removed image, respectively.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
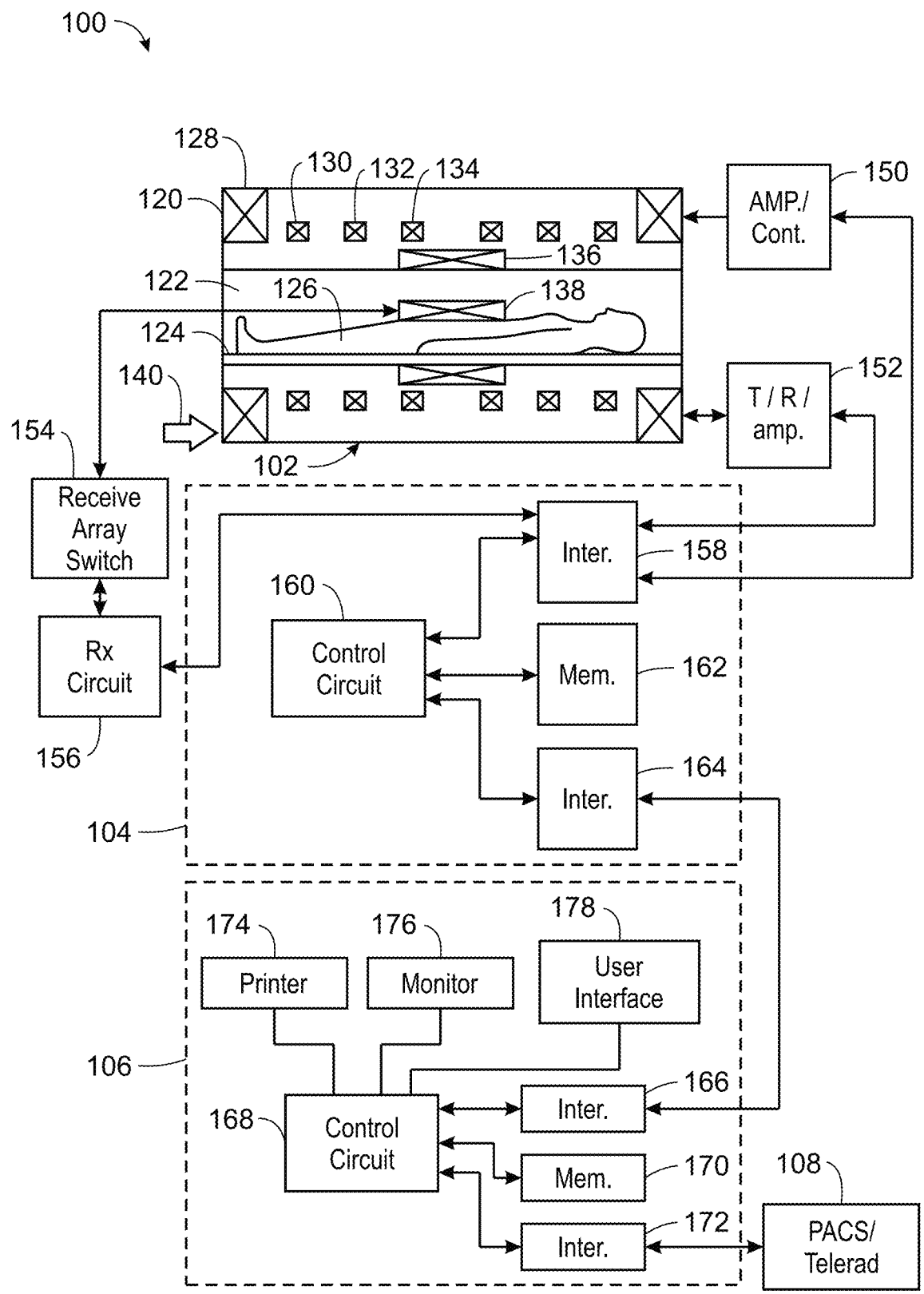
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

Currently, water excitation is utilized with a three-dimensional (3D) double-echo steady-state (DESS) sequence (such as Multi-Echo iN Steady-state Acquisition (MENSA) which is a 3D gradient echo sequence) to suppress fat signals. For 3D DESS with water excitation, the first free induction decay (FID) readout provides high quality anatomical detail, and the second time-reversed steady-state free precession (SSFP)-echo readout provides additional T2-weighting. This sequence has demonstrated benefits for 3D MR neurography. However, due system imperfections (i.e., $B_0$ and $B_1$ inhomogeneities), the fat signals may not be completely suppressed by the spectral-spatial water excitation.

The present disclosure provides systems and methods for a multi-echo steady-state (e.g., with water excitation sequence such as 3D double-echo steady state sequence with water excitation), such as MENSA, with improved fat suppression using an adapted Dixon technique. In particular, the phase behavior of in MENSA and region growing algorithm-like reconstruction are utilized to further suppress the fat signals. The disclosed embodiments may be utilized in various applications such as musculoskeletal MRI and neurography. In the case of neurography, the better suppression of fat improves nerve depiction (e.g., nerves embedded inside a fat pad). The disclosed embodiments improve diagnostic confidence. In certain embodiments, the disclosed embodiments may be utilized with other types multi-echo sequences.

For example, the disclosed embodiments include a computer-implemented method for suppressing fat in reconstructed magnetic resonance imaging data. The computer-implemented method includes generating, via a processor, a first echo image and a second echo image from magnetic resonance scan data acquired of a subject with a magnetic resonance scanner utilizing a multi-echo steady state sequence (e.g., three-dimensional multi-echo steady state with water excitation sequence). The computer-implemented method also includes estimating, via the processor, an echo phase difference between the first echo image and the second echo image to generate an echo phase difference image. The computer-implemented method further includes identifying, via the processor, voxels in the echo phase difference image having an extra chemical shift phase. The computer-implemented method even further includes removing, via the processor, signals of the voxels identified having the extra chemical shift phase in both the first echo image and the second echo image to generate a first fat-removed image and a second fat-removed image, respectively.

In another example, the disclosed embodiments include a system for suppressing fact in reconstructed magnetic resonance imaging data. The system includes memory encoding processor-executable routines. The system also includes a processor configured to access the memory and to execute the processor-executable routines, wherein the processor-executable routines, when executed by the processor, cause the processor to perform actions. The actions include generating a first echo image and a second echo image from magnetic resonance scan data acquired of a subject with a magnetic resonance scanner utilizing a multi-echo steady state sequence (e.g., three-dimensional multi-echo steady state with water excitation sequence). The actions also include estimating an echo phase difference between the first echo image and the second echo image to generate an echo phase difference image. The actions further include identifying voxels in the echo phase difference image having an extra chemical shift phase. The actions even further include removing signals of the voxels identified having the extra chemical shift phase in both the first echo image and the second echo image to generate a first fat-removed image and a second fat-removed image, respectively.

In a further example, a non-transitory computer-readable medium includes processor-executable code that when executed by a processor, causes the processor to perform actions. The actions include generating a first echo image and a second echo image from magnetic resonance scan data acquired of a subject with a magnetic resonance scanner utilizing a multi-echo steady state sequence (e.g., three-dimensional multi-echo steady state with water excitation sequence). The actions also include estimating an echo phase difference between the first echo image and the second echo image to generate an echo phase difference image. The actions further include identifying voxels in the echo phase difference image having an extra chemical shift phase. The actions even further include removing signals of the voxels identified having the extra chemical shift phase in both the first echo image and the second echo image to generate a first fat-removed image and a second fat-removed image, respectively.

In certain embodiments, a region growing algorithm is utilized to identify the voxels having the extra chemical shift phase in the echo phase difference image. In certain embodiments, the first echo image is derived from free induction decay readout in a repetition time and the second echo image is derived from time-reversed steady-state free precession echo readout in the repetition time (i.e., the same repetition time). The first echo image provides clear anatomical demarcation that is primarily defined by T1/T2*. The second echo image has a heavily T2-weighted contrast that in neurography provides high contrast in the peripheral nerves. In certain embodiments, the disclosed embodiments further include generating a reconstructed image by combining the first fat-removed image and the second fat-removed image. In certain embodiments, the extra chemical shift phase is from a water/fat chemical shift. In certain embodiments, the voxels identified having the extra chemical shift phase are fat voxels.

With the preceding in mind, FIG. 1 is a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 to be positioned therein for imaging selected anatomy within the patient.

Scanner 102 includes a series of associated coils for producing controlled magnetic fields for exciting the gyromagnetic material within the anatomy of the subject being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain of the gyromagnetic nuclei within the patient 126 during examination sequences. A radio frequency (RF) coil 136 is configured to generate radio frequency pulses for exciting the certain gyromagnetic nuclei within the patient. In addition to the coils that may be local to the scanner 102, the system 100 also includes a set of receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain of the gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, B0. A power input 44 (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuit 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuit 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuit 104 and system control circuit 106. In certain embodiments, the control and analysis circuit 160, while illustrated as a single unit, may include one or more hardware devices. The system control circuit 106 includes an interface circuit 166, which receives data from the scanner control circuit 104 and transmits data and commands back to the scanner control circuit 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, image reconstruction may occur on a separate computing device having processing circuitry and memory circuitry.

In certain embodiments, the programming code is configured to generate a first echo image and a second echo image from magnetic resonance scan data acquired of a subject with a magnetic resonance scanner utilizing a three-dimensional double-echo steady state with water excitation sequence. The programming code is also configured to estimate an echo phase difference between the first echo image and the second echo image to generate an echo phase difference image. The programming code is further configured to identify voxels in the echo phase difference image having an extra chemical shift phase. The programming code is even further configured to remove signals of the voxels identified having the extra chemical shift phase in both the first echo image and the second echo image to generate a first fat-removed image and a second fat-removed image, respectively.

In certain embodiments, the programming code is configured to utilize a region growing algorithm to identify the voxels having the extra chemical shift phase in the echo phase difference image. In certain embodiments, the first echo image is derived from free induction decay readout in a repetition time and the second echo image is derived from time-reversed steady-state free precession echo readout in the repetition time (i.e., the same repetition time). The first echo image provides clear anatomical demarcation that is primarily defined by T1/T2*. The second echo image has a heavily T2-weighted contrast that in neurography provides higher contrast in the peripheral nerves. In certain embodiments, the programming code is further configured to generate a reconstructed image by combining the first fat-removed image and the second fat-removed image. In certain embodiments, the extra chemical shift phase is from a water/fat chemical shift. In certain embodiments, the voxels identified having the extra chemical shift phase are fat voxels.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
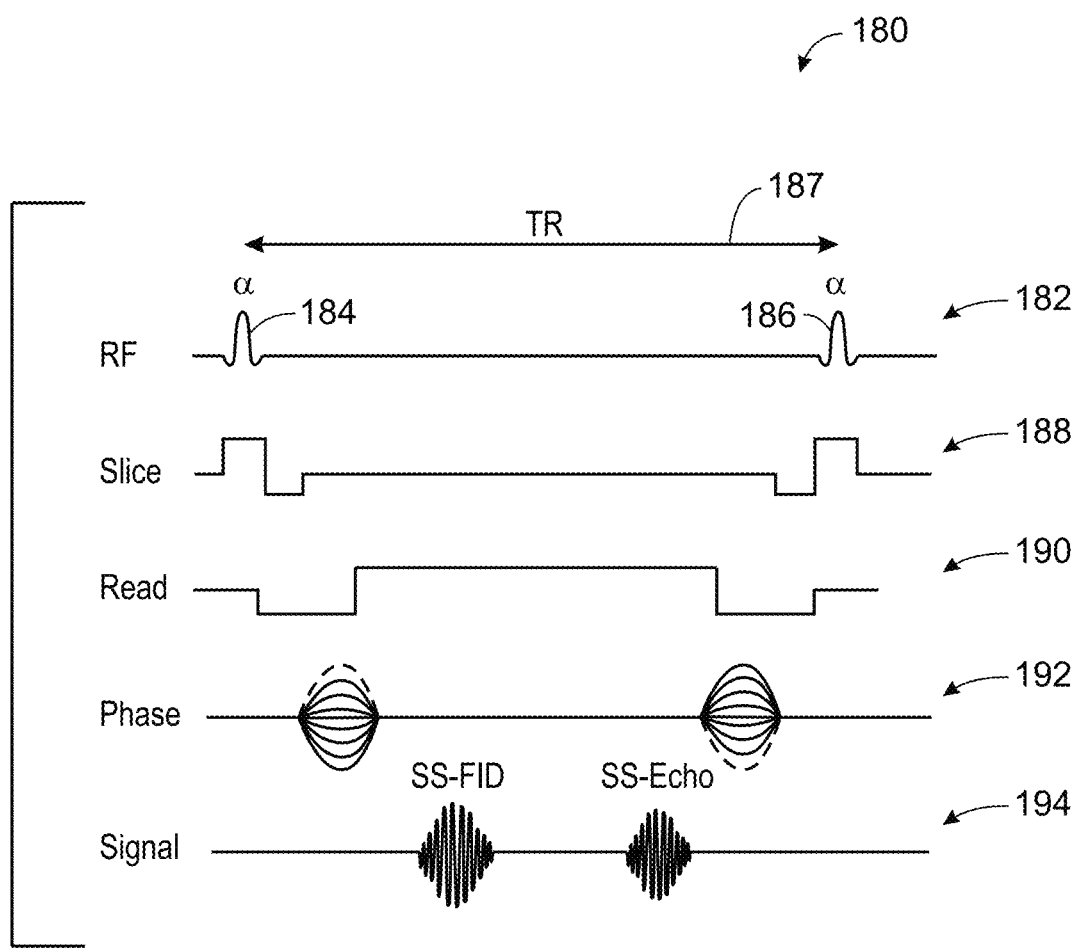
FIG. 2 illustrates a pulse sequence diagram of a multi-echo (e.g., dual echo) steady state pulse sequence with water excitation, in accordance with aspects of the present disclosure.

FIG. 2 illustrates a pulse sequence diagram 180 of a multi-echo (e.g., dual echo) steady state pulse sequence with water excitation. A first row 182 (e.g., top row) of the pulse sequence diagram 180 illustrates RF represents RF over time. As depicted, RF pulses 184, 186 are generated. Reference numeral 187 represents the repetition time (TR) between the RF pulses 184, 186. A second row 188 of the pulse sequence diagram 180 diagram illustrates a gradient (e.g., slice-selective gradient) applied along a slice direction over time. As depicted, the slice-selective gradient is applied at the same time as the RF pulses 184, 186. In particular, the slice-selective gradient is initially applied in a positive direction during the RF pulse 184 and then applied in a negative direction to refocus. Just prior to the RF pulse 186, the slice-selective gradient is applied in a negative direction and is then applied in a positive direction during the RF pulse 186. A third row 190 of the pulse sequence diagram 180 illustrates a gradient (e.g., readout or frequency-encoding gradient) applied along a frequency direction over time. A fourth row 192 of the pulse sequence diagram 180 illustrates a gradient applied along a phase direction over time. As depicted, a fifth row 194 of the pulse sequence diagram 180 illustrates the MRI signal received or obtained during readout. As depicted in the MRI signal, is a first echo 196 and a second echo 198. The first echo 196 is associated with free induction decay. The second echo 198 is associated with time-reversed steady-state free precession. Both the first echo 196 and the second echo 198 occur in the same repetition time 187. The MRI signal is digitized during data acquisition. The vertical axis of each row represents amplitude.

Figure 3:
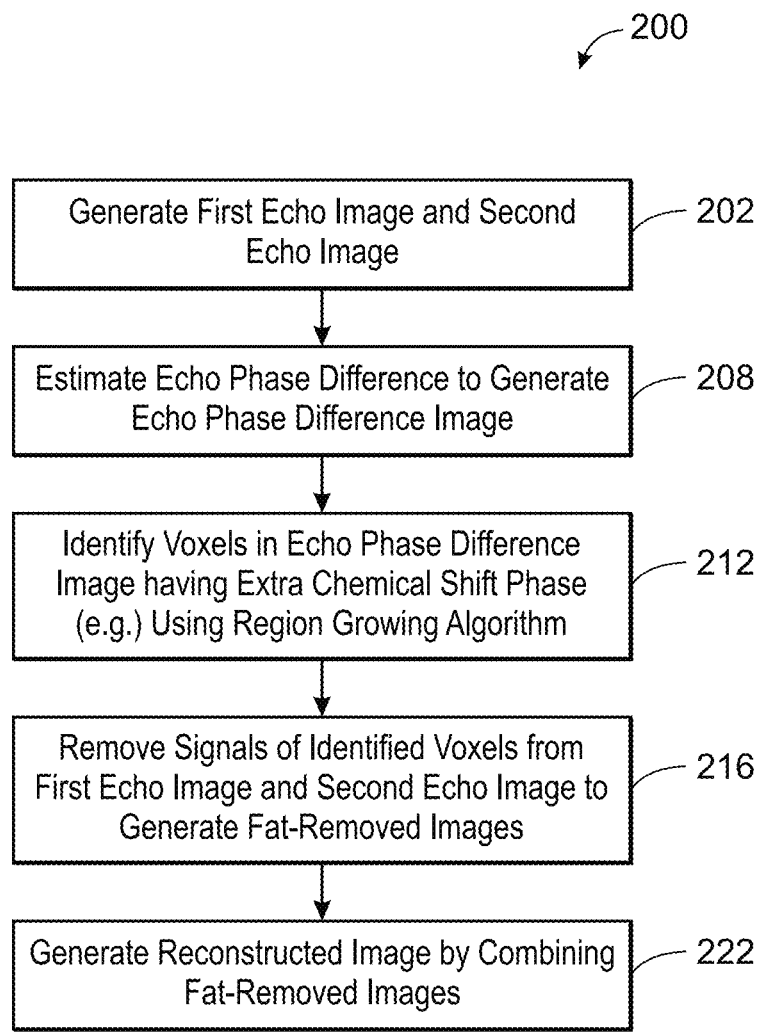
FIG. 3 is a flow chart of a method for suppressing fat in reconstructed magnetic resonance imaging data, in accordance with aspects of the present disclosure.

FIG. 3 is a flow chart of a method 200 for suppressing fat in reconstructed magnetic resonance imaging data. One or more steps of the method 200 may be performed by processing circuitry of the magnetic resonance imaging system 100 in FIG. 1 or a remote computing system. One or more steps of the method 200 may be performed simultaneously or in a different order from that depicted in FIG. 3.

Figure 4:
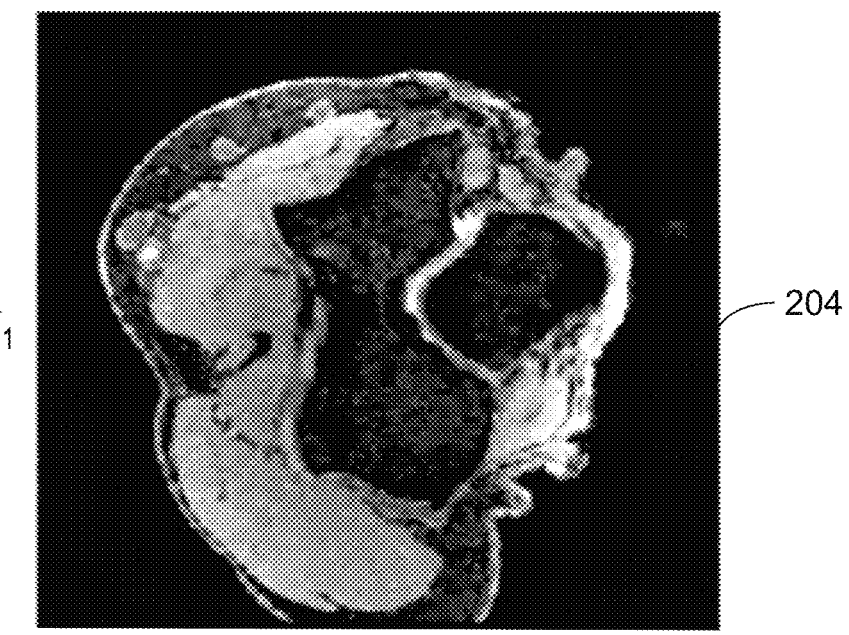
FIG. 4 depicts an example of an echo image (e.g., derived from free induction decay readout), in accordance with aspects of the present disclosure.
Figure 5:
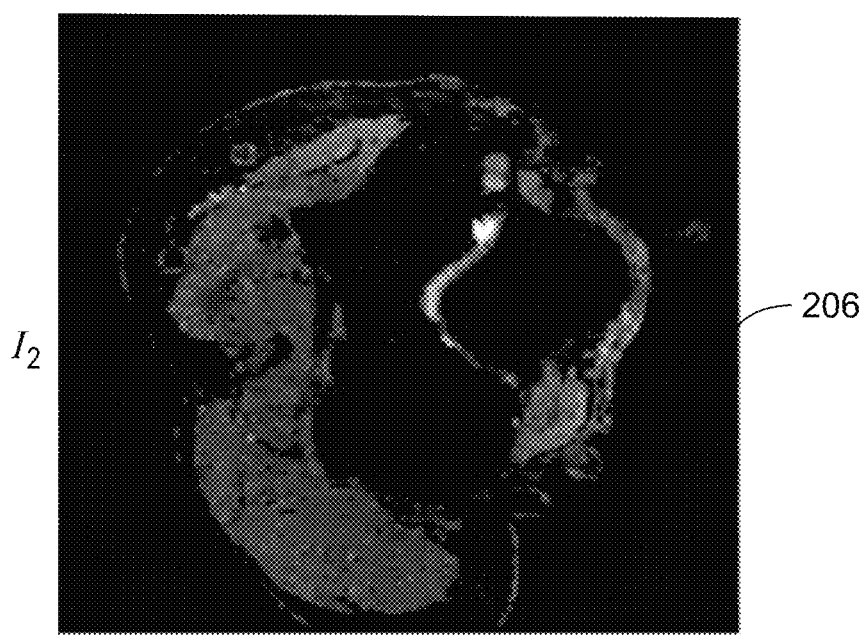
FIG. 5 depicts an example of an echo image (e.g., derived from time-reversed steady-state free precession echo readout), in accordance with aspects of the present disclosure.

The method 200 includes generating a first echo image and a second echo image from magnetic resonance scan data acquired of a subject with a magnetic resonance scanner utilizing a three-dimensional multi-echo steady state with water excitation sequence (block 202). In certain embodiments, the three-dimensional multi-echo steady state with water excitation sequence is a MENSA sequence. In certain embodiments, the first echo image is derived from free induction decay (FID) readout in a repetition time and the second echo image is derived from time-reversed steady-state free precession (SSFP) echo readout in the repetition time (i.e., the same repetition time). The contribution from the residual fat signals in the two readouts (e.g., SSFP-FID and SSFP-Echo) behave similarly to the fat described in the Dixon technique. An adaptation of the Dixon technique (referred to as aDixon herein) as described below enables the identification and removal of the residual fat signals. FIG. 4 depicts an example of a first echo image 204 (e.g., derived from free induction decay readout). FIG. 5 depicts an example of a second echo image 206 (e.g., time-reversed steady-state free precession echo readout). The first echo image 204 and the second echo image 206 were acquired during the same repetition time. The first echo image 204 provides clear anatomical demarcation that is primarily defined by T1/T2*. The second echo image 206 has a heavily T2-weighted contrast that in neurography adds a high signal to the peripheral nerves.

Figure 6:
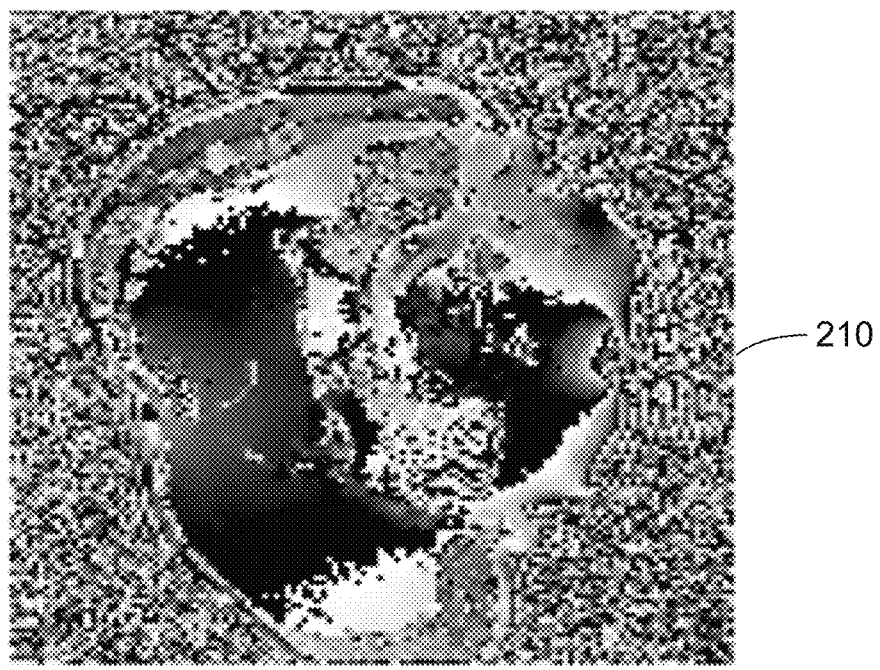
FIG. 6 depicts an example of echo phase difference image, in accordance with aspects of the present disclosure.

Returning to FIG. 3, the method 200 also includes estimating an echo phase difference between the first echo image and the second echo image to generate an echo phase difference image (block 208). FIG. 6 depicts an example of an echo phase difference image 210. The following equations illustrate how echo phase difference is estimated. For MENSA, $S_{W1}$ and $S_{W2}$ represent two echo signals in respective water voxels in the first echo image and the second echo image. $S_{F1}$ and $S_{F2}$ represent two echo signals in respective fat voxels in the first echo image and the second echo image. The equations include:

$$S_{W1} = W_1 e^{i(\phi_0 + \phi_{B0})} \quad (1)$$

$$S_{W2} = W_1 e^{i(\phi_0 - \phi_{B0} + \pi)} \quad (2)$$

$$S_{F1} = F_1 e^{i(\phi_0 + \phi_{B0} + \phi)} \quad (3)$$

$$S_{F2} = F_1 e^{i(\phi_0 - \phi_{B0} - \phi + \pi)} \quad (4)$$

where $\phi_0$ is the initial phase, $\phi_{B0}$ is the $B_0$ phase, and $\phi$ is the phase from water/fact chemical shift. The echo phase difference of a given image consists of a phase difference in water voxels, $d\phi_W$, and a phase difference in fat voxels, $d\phi_F$, as shown in the following equations.

$$d\phi_W = \frac{(\phi_{SW1} - \phi_{SW2} + \pi)}{2} = \phi_{B0} \quad (5)$$

-continued
$$d\phi_F = \frac{(\phi_{SF1} - \phi_{SF2} + \pi)}{2} = \phi_{B0} + \phi \quad (6)$$

As a result, estimating an echo phase difference between the first echo image and the second echo image is represented by the following equation:

$$I_{d\phi} = \sqrt{\frac{I_1 I_2^H e^{-i\pi}}{|I_1 I_2|}}$$

wherein $I_{d\phi}$ is a complex unitary matrix with its phase represents the echo phase difference image, $I_1$ represents the first echo image, $I_2$ represents the second echo image, and H represents the Hermitian operator.

Figure 7:
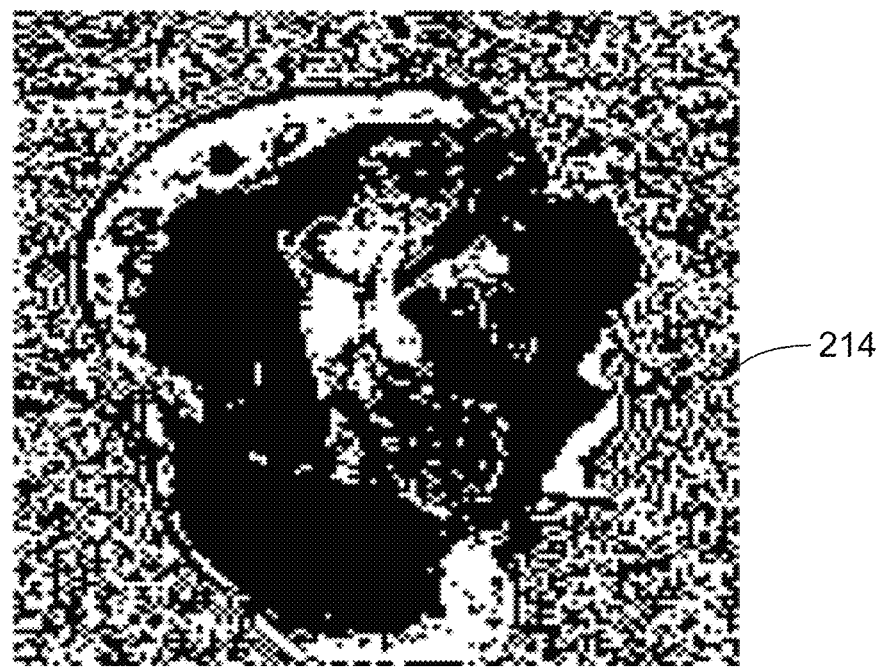
FIG. 7 depicts an example of the echo phase difference image with the voxels having the extras chemical shift phase identified, in accordance with aspects of the present disclosure.

Returning to FIG. 3, the method 200 includes identifying voxels in the echo phase difference image having an extra chemical shift phase ($\phi$) (block 212). In certain embodiments, since both $\phi_{B0}$ and $\phi$ are smooth, a region growing algorithm is utilized to identify the voxels (i.e., fat voxels) having the extra chemical shift phase ($\phi$) in the echo phase difference image. FIG. 7 depicts an example of the echo phase difference image 214 with the voxels having the extras chemical shift phase identified (e.g., highlighted via segmentation mask) via a growing algorithm.

Figure 8:
FIG. 8 depicts an example of a fat-removed image (derived from the echo image in FIG. 4 utilizing the method in FIG. 3), in accordance with aspects of the present disclosure.
Figure 9:
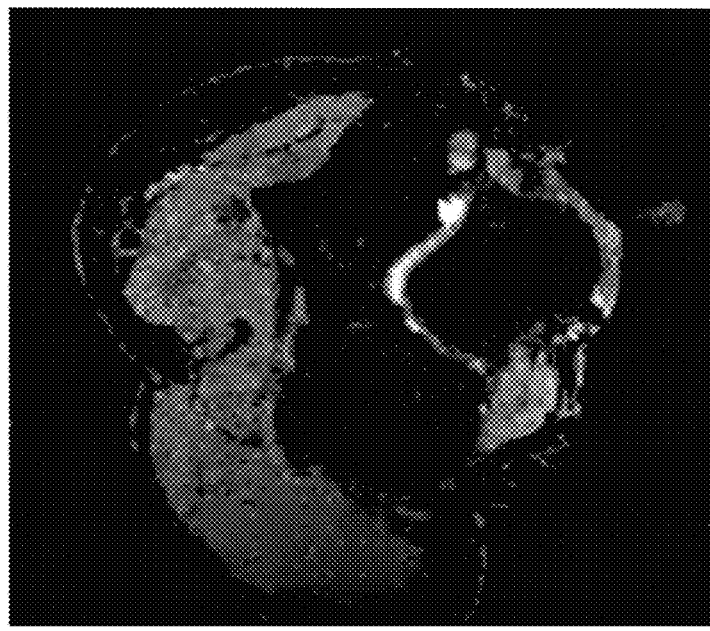
FIG. 9 depicts an example of a fat-removed image (derived from the echo image in FIG. 5 utilizing the method in FIG. 3), in accordance with aspects of the present disclosure.

Returning to FIG. 3, the method 200 includes removing signals of the voxels identified having the extra chemical shift phase in both the first echo image and the second echo image to generate a first fat-removed image and a second fat-removed image, respectively (block 216). FIG. 8 depicts an example of a first fat-removed image 218 (derived from the first echo image 204) with the signals of the identified fat voxels removed. FIG. 9 depicts an example of a second fat-removed image 220 (derived from the second echo image 206) with the signals of the identified fat voxels removed. Blocks 208, 212, and 216 together represent the adapted Dixon (aDixon) technique. The method 200 also includes generating a reconstructed image by combining the first fat-removed image and the second fat-removed image (block 222).

Figure 10:
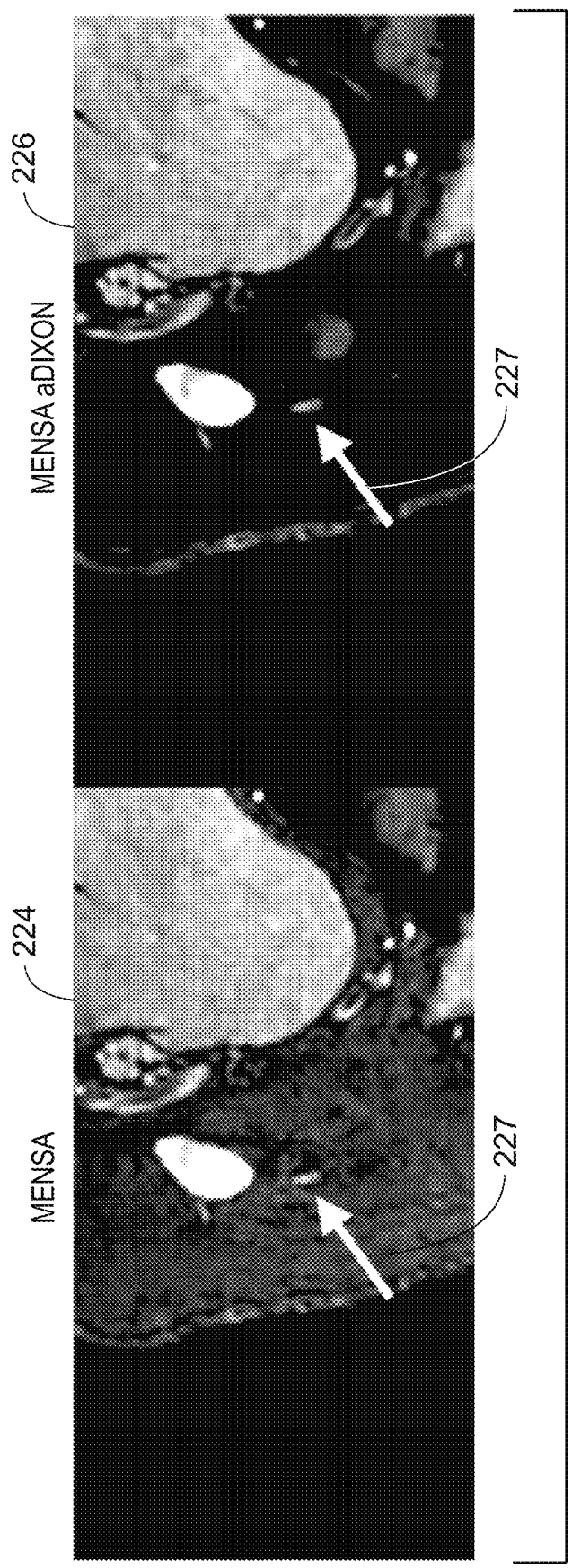
FIG. 10 depicts examples of images of an arm of a subject acquired utilizing multi-echo in steady-state acquisition and reconstructed with typical reconstruction or an adapted Dixon technique as described in the method in FIG. 3, in accordance with aspects of the present disclosure.

FIG. 10 depicts examples of reconstructed images 224, 226 of an arm of a subject. Both images 224, 226 are reconstructed from the same magnetic resonance imaging data acquired utilizing MENSA. Image 224 was reconstructed utilizing typical reconstruction. Image 226 was reconstructed utilizing the adapted Dixon technique as described in the method 200. In comparing images 224 and 226, the medial antebrachial cutaneous nerve (as indicated by arrow 227) is better depicted in image 226. The fat signals are better suppressed around the medial antebrachial cutaneous nerve in image 226. As shown in image 224, spectral-spatial water alone does not completely suppress fat signals due to system imperfections.

Figure 11:
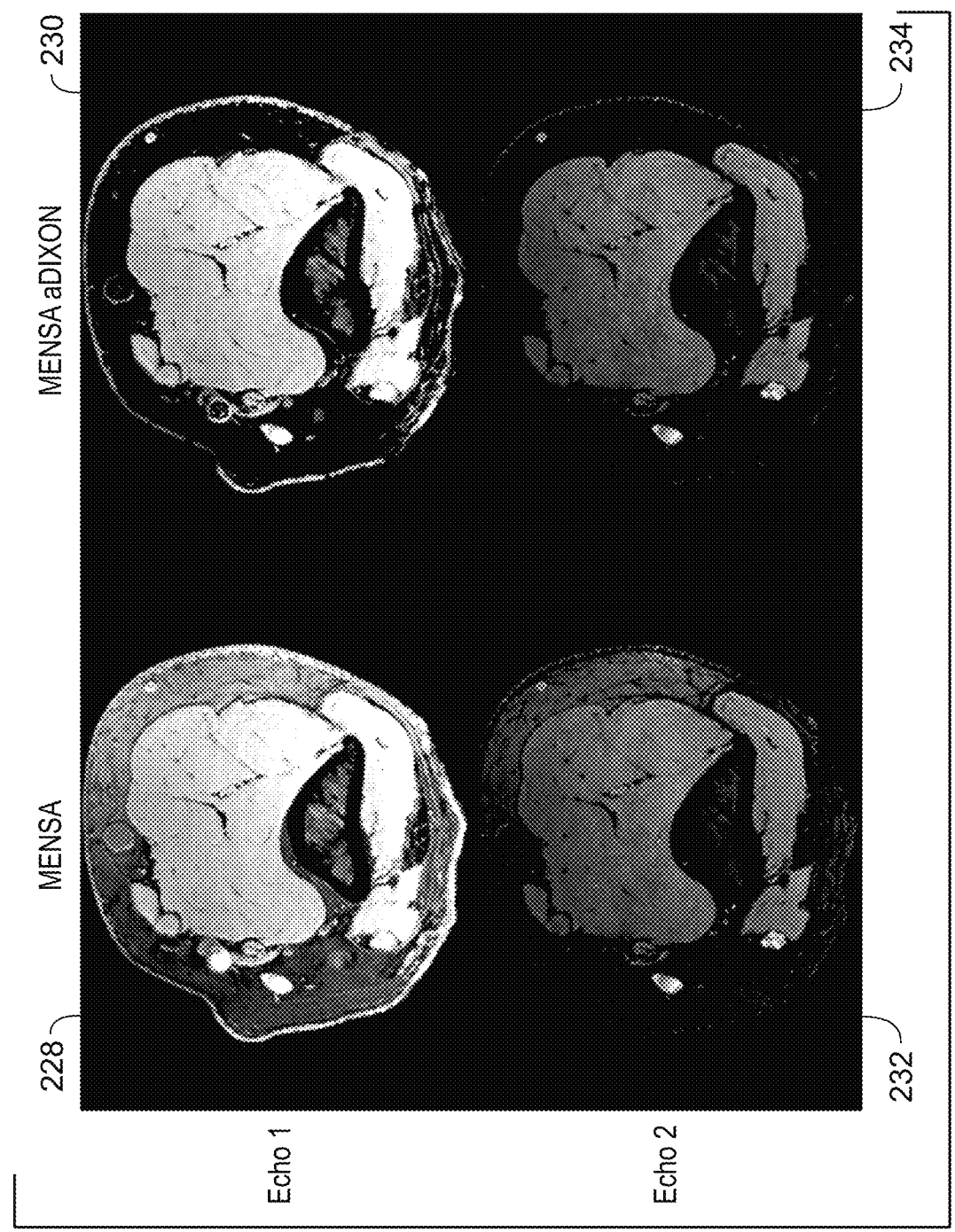
FIG. 11 depicts examples of reconstructed echo (or readout) images of an arm of a subject acquired utilizing multi-echo in steady-state acquisition and reconstructed with typical reconstruction or an adapted Dixon technique as described in the method in FIG. 3, in accordance with aspects of the present disclosure.

FIG. 11 depicts examples of reconstructed echo (or readout) images 228, 230, 232, and 234 of an arm of a subject. Echo images 228, 230, 232, and 234 are reconstructed from the same magnetic resonance imaging data acquired utilizing MENSA. Echo images 228 and 230 are derived from the induction decay readout. Echo images 232 and 234 are derived from the time-reversed steady-state free precession echo readout acquired during the same repetition time as the induction decay readout. The echo images 228 and 230 provide clear anatomical demarcation that is primarily defined by T1/T2*. The echo images 232 and 234 has a heavily T2-weighted contrast that in neurography adds a high signal to the peripheral nerves. Echo images 228 and 232 were reconstructed utilizing typical reconstruction. Echo images 230 and 234 were reconstructed utilizing the adapted Dixon technique as described in the method 200. In comparing echo images 228 and 230 and comparing echo images 232 and 234, the fat suppression is superior in echo images 230 and 234. As shown in echo images 228 and 232, spectral-spatial water alone does not completely suppress fat signals due to system imperfections. As depicted in the echo images 230 and 234, the relative signal levels of the nerves relative to muscle are not altered. The lack of significant change in muscle contrast in the adapted Dixon technique suggests that it does not adversely affect interpretation of nerve and muscle signal.

Figure 12:
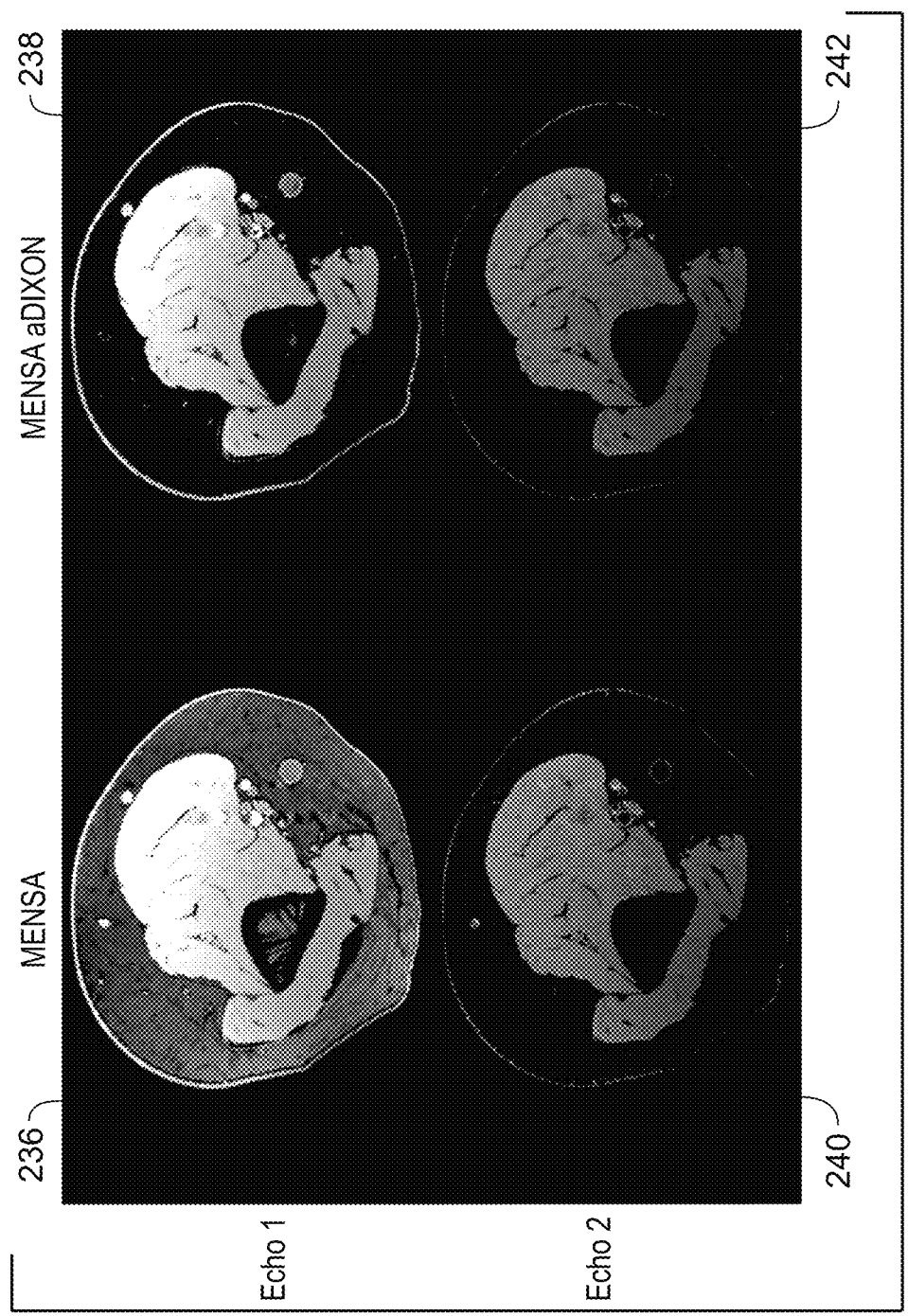
FIG. 12 depicts additional examples of reconstructed echo (or readout) images of an arm of a subject acquired utilizing multi-echo in steady-state acquisition and reconstructed with typical reconstruction or an adapted Dixon technique as described in the method in FIG. 3, in accordance with aspects of the present disclosure.

FIG. 12 depicts additional examples of reconstructed echo (or readout) images 236, 238, 240, and 242 of an arm of a subject. Echo images 236, 238, 240, and 242 are reconstructed from the same magnetic resonance imaging data acquired utilizing MENSA. Echo images 236 and 238 are derived from the induction decay readout. Echo images 240 and 242 are derived from the time-reversed steady-state free precession echo readout acquired during the same repetition time as the induction decay readout. The echo images 236 and 238 provide clear anatomical demarcation that is primarily defined by T1/T2*. The echo images 240 and 242 has a heavily T2-weighted contrast that in neurography adds a high signal to the peripheral nerves. Echo images 236 and 240 were reconstructed utilizing typical reconstruction. Echo images 238 and 242 were reconstructed utilizing the adapted Dixon technique as described in the method 200. In comparing echo images 236 and 238 and comparing echo images 240 and 242, the fat signals are better suppressed in echo images 238 and 242. As shown in echo images 236 and 240, spectral-spatial water alone does not completely suppress fat signals due to system imperfections. As depicted in the echo images 238 and 242, the relative signal levels of the nerve to muscle are also not altered. The lack of significant change in muscle contrast in the adapted Dixon technique suggests that it does not adversely affect the nerve and muscle signal interpretation.

Figure 13:
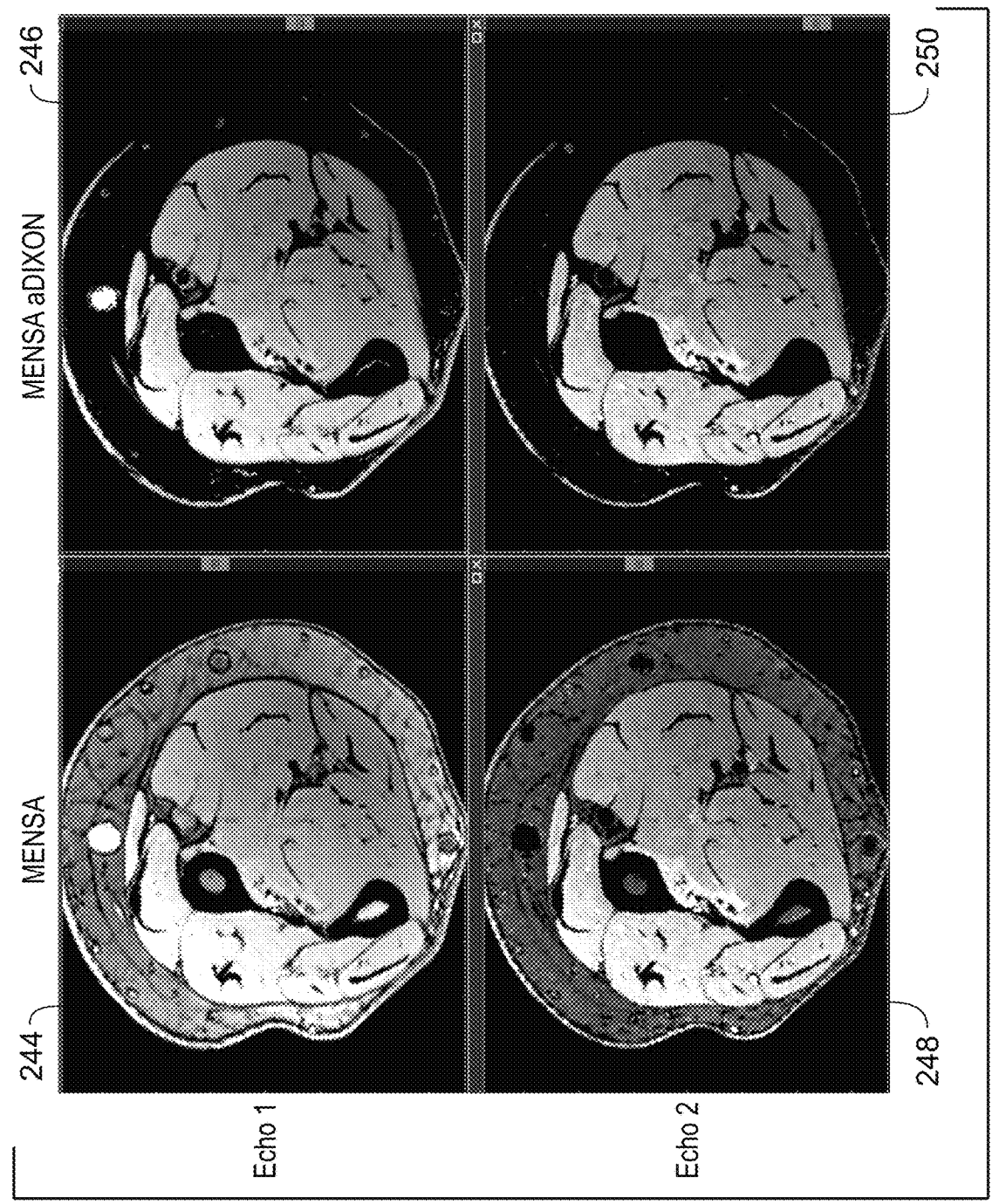
FIG. 13 depicts additional examples of reconstructed echo (or readout) images of a forearm of a subject acquired utilizing multi-echo in steady-state acquisition and reconstructed with typical reconstruction or an adapted Dixon technique as described in the method in FIG. 3, in accordance with aspects of the present disclosure.

FIG. 13 depicts further examples of reconstructed echo (or readout) images 244, 246, 248, and 250 of a forearm of a subject. Echo images 244, 246, 248, and 250 are reconstructed from the same magnetic resonance imaging data acquired utilizing MENSA. Echo images 244 and 246 are derived from the induction decay readout. Echo images 248 and 250 are derived from the time-reversed steady-state free precession echo readout acquired during the same repetition time as the induction decay readout. The echo images 244 and 246 provide clear anatomical demarcation that is primarily defined by T1/T2*. The echo images 248 and 250 has a heavily T2-weighted contrast that in neurography adds a high signal to the peripheral nerves. Echo images 244 and 248 were reconstructed utilizing typical reconstruction. Echo images 246 and 250 were reconstructed utilizing the adapted Dixon technique as described in the method 200. In comparing echo images 244 and 246 and comparing echo images 248 and 250, the regions of the muscle edema are better depicted in echo images 246 and 250. This is because the fat signals are better suppressed in echo images 246 and 250. As shown in echo images 244 and 248, spectral-spatial water alone does not completely suppress fat signals due to system imperfections.

Figure 14:
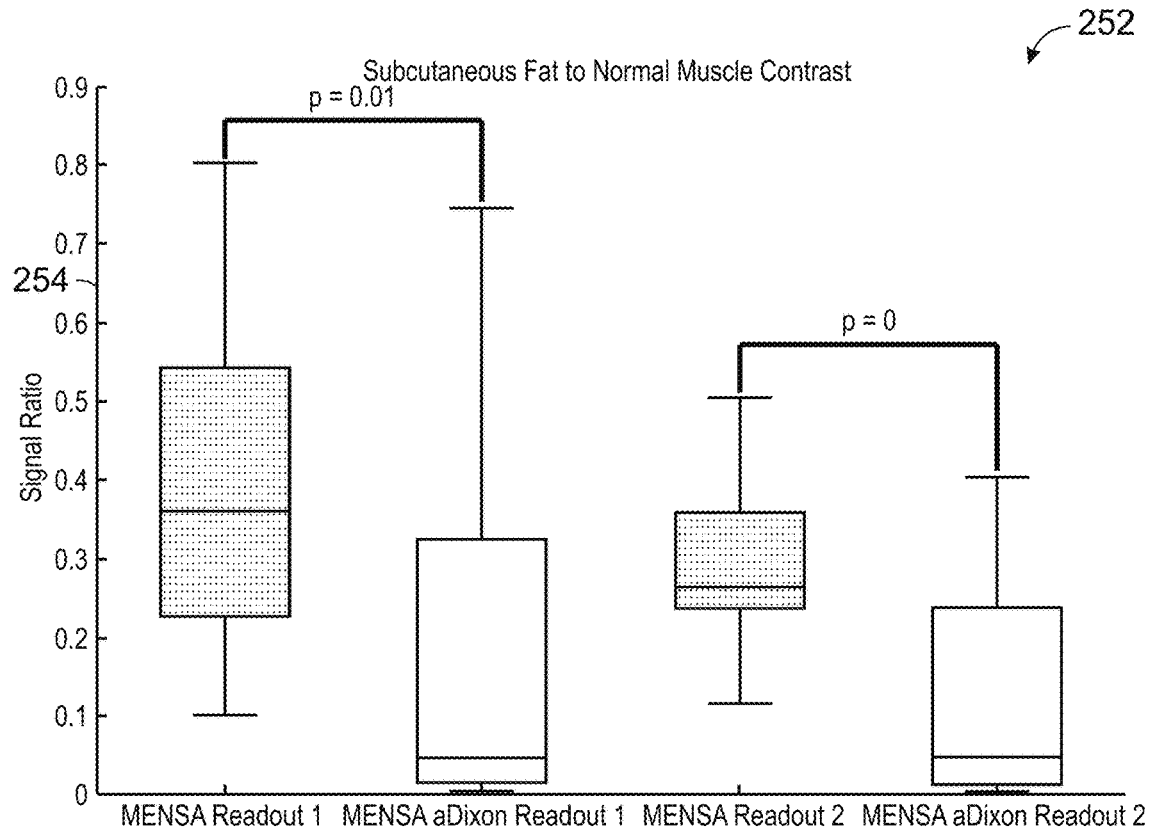
FIG. 14 depicts a boxplot analyzing average contrast between subcutaneous fat and normal muscle for echo (or readout) images acquired utilizing multi-echo in steady-state acquisition and reconstructed with typical reconstruction or an adapted Dixon technique as described in the method in FIG. 3, in accordance with aspects of the present disclosure.

FIG. 14 depicts a boxplot 252 analyzing average contrast between subcutaneous fat and normal muscle (e.g., without muscle edema or fatty infiltration) for echo (or readout) images of an upper extremity of subjects acquired utilizing MENSA and reconstructed with typical reconstruction or an adapted Dixon technique as described in the method in FIG. 3. Regions of subcutaneous fat and normal appearing muscle in the echo images were analyzed. The fat-to-normal muscle contrast was obtained as the ratio between the corresponding signals. A non-parametric Wilcoxon signed rank test was used to compare the contrasts between conventional reconstruction and reconstruction with the adapted Dixon technique, with $p<0.05$ deemed statistically significant. Echo or readout images are designated MENSA Readout 1 that are derived from the induction decay readout and reconstructed utilizing typical reconstruction. Echo or readout images designated as MENSA Readout 2 are derived from the time-reversed steady-state free precession echo readout acquired during the same repetition time as the induction decay readout and reconstructed utilizing typical reconstruction. Echo or readout images are designated MENSA aDixon Readout 1 that are derived from the induction decay readout and reconstructed utilizing the adapted Dixon technique as described in the method in FIG. 3. Echo or readout images are designated MENSA aDixon Readout 2 are derived from the time-reversed steady-state free precession echo readout acquired during the same repetition time as the induction decay readout and reconstructed utilizing the adapted Dixon technique as described in the method in FIG. 3. The y-axis 254 represents the signal ratio. As depicted in the boxplot 252, the average contrast between subcutaneous fat and normal muscle was 52 percent lower ($p=0.010$) in MENSA aDixon Readout 1 compared to MENSA Readout 1. As depicted in boxplot 252, the average contrast between subcutaneous fat and normal muscle was 56 percent lower ($p<0.001$) in MENSA aDixon Readout 2 compared to MENSA Readout 2.

Figure 15:
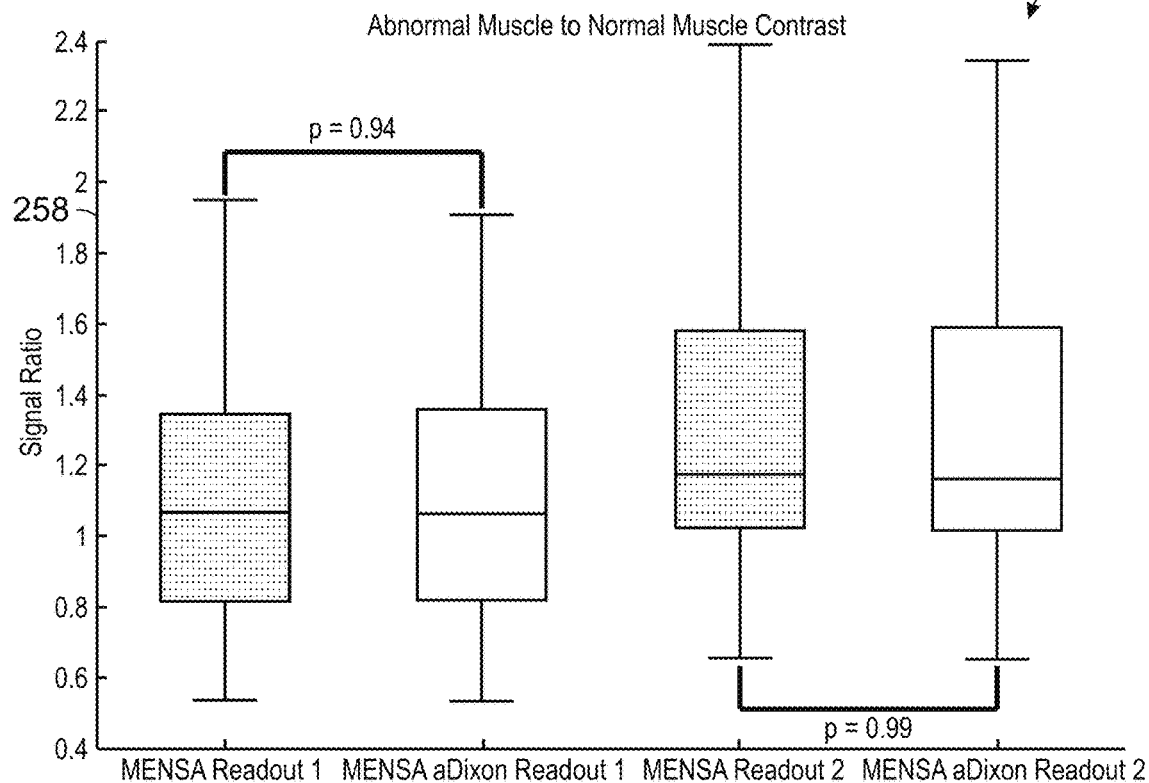
FIG. 15 depicts tables analyzing average contrast between abnormal muscle and normal muscle for echo (or readout) images acquired utilizing multi-echo in steady-state acquisition and reconstructed with typical reconstruction or an adapted Dixon technique as described in the method in FIG. 3, in accordance with aspects of the present disclosure.

FIG. 15 depicts a boxplot 256 analyzing average contrast between abnormal muscle (e.g., as determined by electromyography) and normal muscle (e.g., without muscle edema or fatty infiltration) for echo (or readout) images of an upper extremity of subjects acquired utilizing MENSA and reconstructed with typical reconstruction or an adapted Dixon technique as described in the method in FIG. 3. Regions of normal appearing muscle and abnormal muscle in the echo images were analyzed. The abnormal-to-normal muscle contrast was obtained as the ratio between the corresponding signals. A non-parametric Wilcoxon signed rank test was used to compare the contrasts between conventional reconstruction and reconstruction with the adapted Dixon technique, with $p<0.05$ deemed statistically significant. Echo or readout images are designated MENSA Readout 1 that are derived from the induction decay readout and reconstructed utilizing typical reconstruction. Echo or readout images are designated MENSA Readout 2 are derived from the time-reversed steady-state free precession echo readout acquired during the same repetition time as the induction decay readout and reconstructed utilizing typical reconstruction. Echo or readout images are designated MENSA aDixon Readout 1 that are derived from the induction decay readout and reconstructed utilizing the adapted Dixon technique as described in the method in FIG. 3. Echo or readout images are designated MENSA aDixon Readout 2 are derived from the time-reversed steady-state free precession echo readout acquired during the same repetition time as the induction decay readout and reconstructed utilizing the adapted Dixon technique as described in the method in FIG. 3. The y-axis 258 represents the signal ratio. As depicted in the boxplot 256, the average contrast between abnormal muscle and normal muscle showed no considerable change (1.116 versus 1.105, p=0.94) between MENSA aDixon Readout 1 and MENSA Readout 1. As depicted in boxplot 256, the average contrast between abnormal muscle and normal muscle showed no considerable change (1.298 versus 1.296, p=0.99) between MENSA aDixon Readout 2 and MENSA Readout 2.

Technical effects of the disclosed subject matter include providing for a double-echo steady-state with excitation sequence (e.g., 3D double-echo steady state sequence), such as MENSA, with improved fat suppression using an adapted Dixon technique. In particular, the phase behavior of in MENSA and region growing algorithm-like reconstruction are utilized to further suppress the fat signals. The subject matter may be utilized in various applications such as musculoskeletal MRI and neurography. In the case of neurography, the better suppression of fat improves nerve depiction (e.g., nerves embedded inside a fat pad). Technical effects of the disclosed subject matter include improving diagnostic confidence.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . ." or "step for [perform]ing [a function] . . .", it is intended that such elements are to be interpreted under 35 U.S.C. 112(f). However, for any claims containing elements designated in any other manner, it is intended that such elements are not to be interpreted under 35 U.S.C. 112(f).

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A computer-implemented method for suppressing fat in reconstructed magnetic resonance imaging data, comprising:
generating, via a processor, a first echo image and a second echo image from magnetic resonance scan data acquired of a subject with a magnetic resonance scanner utilizing a multi-echo steady state sequence;
estimating, via the processor, an echo phase difference between the first echo image and the second echo image to generate an echo phase difference image;
identifying, via the processor, voxels in the echo phase difference image having an extra chemical shift phase, wherein a region growing algorithm is utilized to identify the voxels having the extra chemical shift phase in the echo phase difference image; and
removing, via the processor, signals of the voxels identified having the extra chemical shift phase in both the first echo image and the second echo image to generate a first fat-removed image and a second fat-removed image, respectively.

2. The computer-implemented method of claim 1, wherein the first echo image is derived from free induction decay readout in a repetition time and the second echo image is derived from time-reversed steady-state free precession echo readout in the repetition time.

3. The computer-implemented method of claim 1, further comprising generating a reconstructed image by combining the first fat-removed image and the second fat-removed image.

4. The computer-implemented method of claim 1, wherein the echo phase difference is estimated utilizing the following equation:

$$I_{d\phi} = \sqrt{\frac{I_1 I_2^H e^{-i\pi}}{|I_1 I_2|}}$$

wherein $I_{d\phi}$ is a complex unitary matrix with its phase represents the echo phase difference image, $I_1$ represents the first echo image, $I_2$ represents the second echo image, and H represents the Hermitian operator.

5. The computer-implemented method of claim 1, wherein the extra chemical shift phase is from a water/fat chemical shift.

6. The computer-implemented method of claim 5, wherein the voxels identified having the extra chemical shift phase are fat voxels.

7. The computer-implemented method of claim 1, wherein the multi-echo steady state sequence is utilized in conjunction with water excitation pulses.

8. A system for suppressing fat in reconstructed magnetic resonance imaging data, comprising:
a memory encoding processor-executable routines;
a processor configured to access the memory and to execute the processor-executable routines, wherein the processor-executable routines, when executed by the processor, cause the processor to:
generate a first echo image and a second echo image from magnetic resonance scan data acquired of a subject with a magnetic resonance scanner utilizing a multi-echo steady state sequence;
estimate an echo phase difference between the first echo image and the second echo image to generate an echo phase difference image;
identify voxels in the echo phase difference image having an extra chemical shift phase, wherein a region growing algorithm is utilized to identify the voxels having the extra chemical shift phase in the echo phase difference image; and
remove signals of the voxels identified having the extra chemical shift phase in both the first echo image and the second echo image to generate a first fat-removed image and a second fat-removed image, respectively.

9. The system of claim 8, wherein the first echo image is derived from free induction decay readout and the second echo image is derived from time-reversed steady-state free precession echo readout.

10. The system of claim 8, wherein the processor-executable routines, when executed by the processor, further cause the processor to generate a reconstructed image by combining the first fat-removed image and the second fat-removed image.

11. The system of claim 8, wherein the echo phase difference is estimated utilizing the following equation:

$$I_{d\phi} = \sqrt{\frac{I_1 I_2^H e^{-i\pi}}{|I_1 I_2|}}$$

wherein $I_{d\phi}$ is a complex unitary matrix with its phase represents the echo phase difference image, $I_1$ represents the first echo image, $I_2$ represents the second echo image, and H represents the Hermitian operator.

12. The system of claim 8, wherein the extra chemical shift phase is from a water/fat chemical shift.

13. The system of claim 12, wherein the voxels identified having the extra chemical shift phase are fat voxels.

14. A non-transitory computer-readable medium, the computer-readable medium comprising processor-executable code that when executed by a processor, causes the processor to:
   generate a first echo image and a second echo image from magnetic resonance scan data acquired of a subject with a magnetic resonance scanner utilizing a multi-echo steady state sequence;
   estimate an echo phase difference between the first echo image and the second echo image to generate an echo phase difference image;
   identify voxels in the echo phase difference image having an extra chemical shift phase, wherein a region growing algorithm is utilized to identify the voxels having the extra chemical shift phase in the echo phase difference image; and
   remove signals of the voxels identified having the extra chemical shift phase in both the first echo image and the second echo image to generate a first fat-removed image and a second fat-removed image, respectively.

15. The non-transitory computer-readable medium of claim 14, wherein the first echo image is derived from free induction decay readout in a repetition time and the second echo image is derived from time-reversed steady-state free precession echo readout in the repetition time.

16. The non-transitory computer-readable medium of claim 14, wherein the processor-executable code, when executed by the processor, further causes the processor to generate a reconstructed image by combining the first fat-removed image and the second fat-removed image.

17. The non-transitory computer-readable medium of claim 14, wherein the extra chemical shift phase is from a water/fat chemical shift, and wherein the voxels identified having the extra chemical shift phase are fat voxels.

* * * * *